United States Patent
Rashid

(10) Patent No.: US 6,891,102 B2
(45) Date of Patent: May 10, 2005

(54) ELECTROMAGNETIC RADIATION INSULATED ELECTRICAL APPLIANCE

(76) Inventor: Abul Rashid, 16321 Pacific Coast Hwy., No. 89, Pacific Palisade, CA (US) 90272

( * ) Notice: Subject to any disclaimer, the term of this patent is extended or adjusted under 35 U.S.C. 154(b) by 0 days.

(21) Appl. No.: 10/420,618

(22) Filed: Apr. 21, 2003

(65) Prior Publication Data

US 2004/0206526 A1 Oct. 21, 2004

(51) Int. Cl.[7] ............................................. H05K 9/00
(52) U.S. Cl. .............................. 174/35 R; 174/35 MS; 392/385
(58) Field of Search .................... 174/35 R, 35 GC, 174/35 MS, 36; 361/816, 818; 392/385, 383, 384

(56) References Cited

U.S. PATENT DOCUMENTS

| | | | |
|---|---|---|---|
| 5,504,274 A | * | 4/1996 | McCabe et al. ............. 174/36 |
| 6,226,450 B1 | * | 5/2001 | Lee ............................ 392/385 |
| 2003/0196344 A1 | * | 10/2003 | Park ............................. 34/96 |

* cited by examiner

*Primary Examiner*—Dean A. Reichard
*Assistant Examiner*—Carmelo Oliva

(57) ABSTRACT

An electrical appliance and, particularly, a hand-held appliance of the type used in close proximity to an individual, such as a hair dryer, cellular telephone, or the like, and which is shielded from emission of electromagnetic radiation. Appliances which are particularly susceptible to generation of electromagnetic radiation are those which include electrical coils as, for example, transformer coils or heating coils. In all cases, the appliance is provided with a shield substantially covering the exterior surface of the appliance. In the case of a hair dryer and similar appliances which have a long tubular barrel and a hand grip portion, both the barrel and the hand grip portion are completely covered with an electromagnetic insulating material. The preferred electromagnetic insulating materials which may be employed, for this purpose, are materials having a high degree of magnetic permeability, usually in the nature of iron alloys. Also in accordance with the present invention, it has been found that by double winding any coils, that is having a first set of coils wound in a first direction and a second set of coils wound in a second direction, that radiation emission is substantially reduced. It has also been found that when the electrical wire extending through the appliance is wound in the form of a braid, that electromagnetic radiation is still further reduced.

19 Claims, 2 Drawing Sheets

ELECTROMAGNETIC RADIATION INSULATED ELECTRICAL APPLIANCE

BACKGROUND OF THE INVENTION

1. Field of the Invention

This invention relates in general to certain new and useful improvements in electrical appliances which are shielded against emission of electromagnetic radiation and, more particularly, to electrical appliances of the type which are used in close proximity to human beings and which would otherwise generate a substantial amount of electromagnetic radiation.

2. Brief Description of the Related Art

For some period of time, it has been recognized that high voltage concentrations as, for example, in overhead utility power lines, can create electromagnetic radiation in amounts which could be potentially harmful to human beings, particularly after long periods of exposure. However, in recent years, it has also become known that electromagnetic radiation, even of relatively smaller amounts but generated in close proximity to a human being, as, for example, from an appliance and which appliance is regularly used by that individual, can also be harmed by this exposure to electromagnetic radiation.

It has also become recently established that electrical appliances of the type which use electrical coils as, for example, transformer coils, or heating coils, or the like, are particularly problem some in the generation of electromagnetic radiation, due to the relatively long length of electrical wire which is used therein. However, and although one could readily conclude that shielding of an electrical appliance is desirable, there has not been any proposal to shield these devices so that electromagnetic radiation emission is not significant.

One of the most pronounced problems with hand-held appliances arises in the use of electrically operated hand-held hair dryers. These dryers use electrical coils, particularly heating coils, and are now recognized to generate a substantial amount of electromagnetic radiation. Although the radiation which is generated is not, in and of itself, very strong, after frequent use of an appliance such as these hair dryers, e.g. on a daily basis, an individual does become exposed to a substantial amount of the electromagnetic radiation.

A recent study of electromagnetic field radiation from hair dryers reveals that leukemia may be linked to these electromagnetic fields. It has been found that the electromagnetic fields generated by hair dryers were substantially greater than two milli-Gauss. Moreover, the National Counsel on Radiation Protection and Measurement (NCEP) has recommended to the U.S. Congress that the exposure of electromagnetic field radiation to individuals be limited to no more than two milli-Gauss. There is now some fear that this electromagnetic radiation can lead to or otherwise contribute to the possibility of autodegenerative disease.

It would therefore be desirable to provide some means to shield an individual from electromagnetic radiation emission from an appliance and, particularly, a hand-held appliance which is used in close proximity to the body of an individual.

It has also been recently found that cellular telephones potentially are a serious health hazard, since they are used in very close proximity to the head of a user. The frequent use of these telephones have resulted in the occurrence of migraine headaches and dizziness in certain individuals. Here again, it is believed that this has been caused by the electromagnetic radiation generated from such cellular telephones.

OBJECTS OF THE INVENTION

It is, therefore, one of the primary objects of the present invention to provide an appliance which is shielded to prevent any substantial amount of electromagnetic radiation leakage.

It is another object of the present invention to provide an appliance of the type stated in which a substantial portion of the outer body of that appliance and, particularly, portions which are susceptible of generating electromagnetic radiation are shielded.

It is a further object of the present invention to provide an electromagnetically shielded appliance of the type stated and which is particularly in the nature of a hand-held appliance.

It is an additional object of the present invention to provide an electromagnetically shielded hair dryer and, particularly, hair dryers which have an elongate barrel as well as a hand grip portion thereon, and where both the barrel and the hand grip portion are shielded to prevent emission of electromagnetic radiation.

It is still a further object of the present invention to provide an appliance which is shielded to limit electromagnetic field radiation to no more than two milli-Gauss.

It is also an object of the present invention to provide an appliance which has electromagnetic radiation insulation on the outer body and which is also modified in the electrical portion thereof to reduce emission of electromagnetic radiation.

It is yet another object of the present invention to provide a method of reducing the emission of electromagnetic radiation generated from an appliance and, particularly, from an appliance which is used in close proximity to the body of an individual using that appliance.

With the above and other objects in view, my invention resides in the novel features of form, construction, arrangement and combination of parts presently described and pointed out in the claims.

SUMMARY OF THE INVENTION

An appliance and, particularly, a household appliance of the type capable of generating electromagnetic radiation and which is insulated on a substantial portion of its exterior surface to prevent the exposure of an individual using that appliance to that radiation.

The appliance of the present invention is typically one which is a hand-held appliance and one which, therefore, by it nature would result in close contact of an individual with a source of electromagnetic radiation. Thus, appliances of the type which are encompassed by the present invention are hair dryers, blowers, cellular telephones, and the like.

In order to reduce the exposure of an individual using this appliance to electromagnetic radiation, the outer body shell is typically covered. Moreover and preferably the entire exposed surface of the outer body shell of the appliance is shielded with an electromagnetic radiation insulating material extending about a substantial portion of the outer body of that appliance. In this way, electromagnetic energy which may be generated in that appliance is insulated from exposure to an outside environment.

In the case of appliances which have a hand grip portion and a barrel portion, both the barrel portion and the hand grip portion are insulated with an electromagnetic radiation insulating material. Where the appliance does have an elongate barrel portion, it has been found to be desirable to literally extend the electromagnetic radiation insulation material beyond the body of the outer housing. Also, in the case of appliances such as cellular telephones, again the outer housing, with the exception of the face plate for viewing and the push button switches, is insulated with metal materials, and preferably iron alloys, having a high degree of magnetic permeability in the range of at least ten thousand or greater. Several of the electromagnetic radiation insulating materials are hereinafter described in more detail.

It has also been found in accordance with the present invention that the insulation should fit very snugly against the outer housing of the hand-held appliance, such as a hand-held hair dryer. In addition, it has been found in accordance with the present invention that where coils are present in the device as, for example, in a heating coil, the heating coil must be arranged so that it doubles back upon itself. In other words, there must be loops extending in one direction and loops extending concentrically around or otherwise coaxial with the first set of loops in an opposite direction. This has been found to effectively cancel out a substantial portion of the electromagnetic energy which might otherwise be generated.

Finally, it has also been found that by winding of any of the loose wires associated within the appliance in the form of a braid will also reduce the amount of electromagnetic energy emission which might otherwise result.

This invention possesses many other advantages and has other purposes which may be made more clearly apparent from a consideration of the forms in which it may be embodied. These forms are shown in the drawings forming a part of and accompanying the present specification. They will now be described in detail for the purposes of illustrating the general principles of the invention, but it is to be understood that such detailed description is not to be taken in a limiting sense.

BRIEF DESCRIPTION OF THE DRAWINGS

Figure 1:
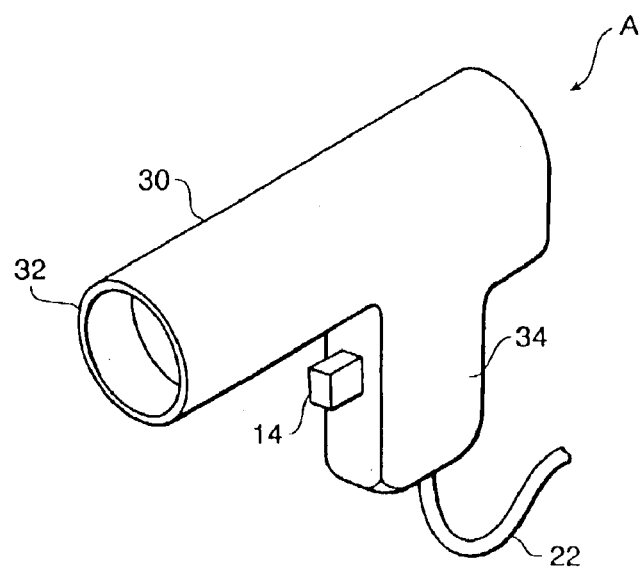
Figure 2:
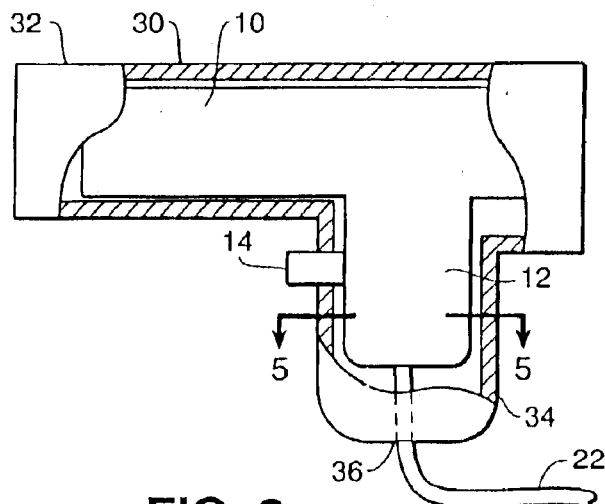
Figure 3:
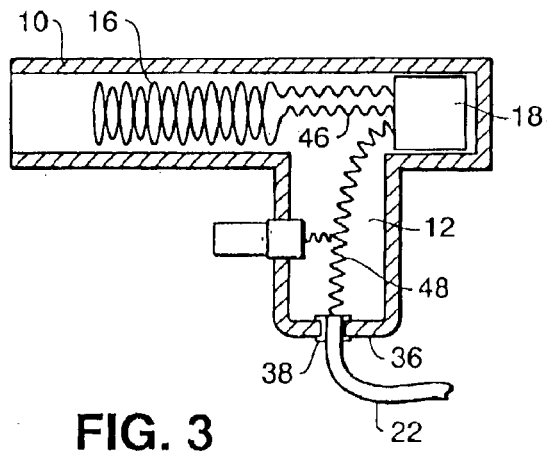
Figure 4:
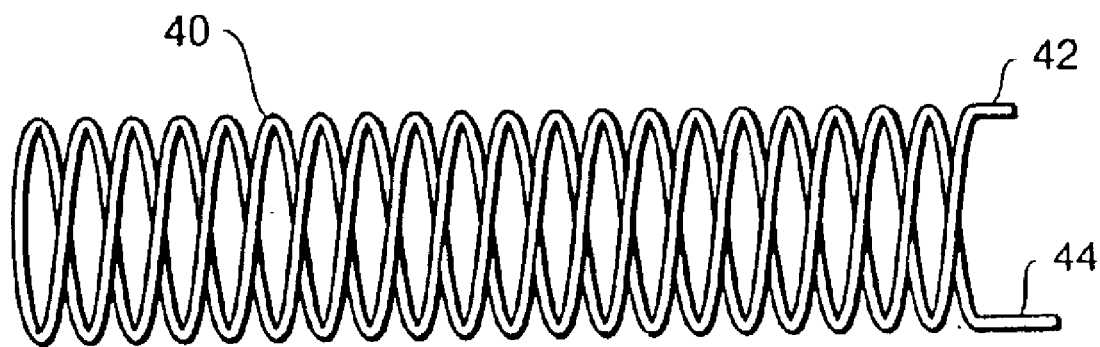
Figure 5:
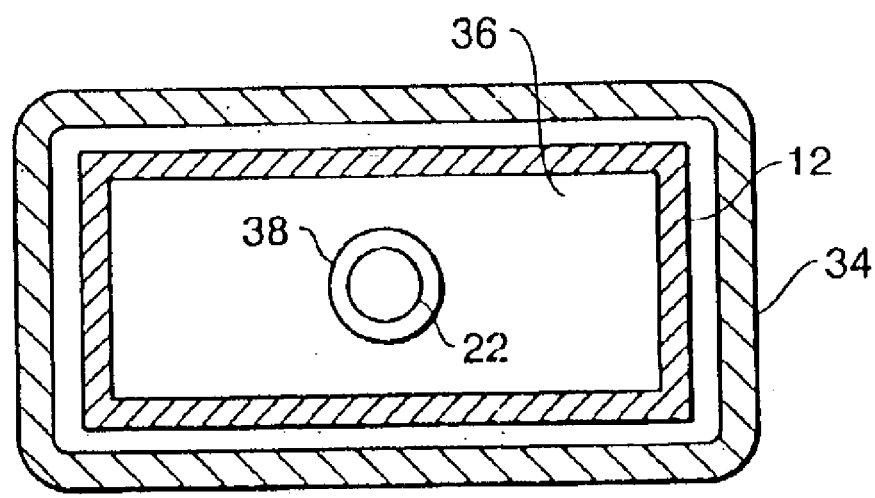

Having thus described the invention in general terms, reference will now be made to the accompanying drawings in which:

FIG. 1 is a perspective view of an appliance in the nature of a hand-held hair dryer and which is shielded against exposure of electromagnetic radiation in accordance with the present invention;

FIG. 2 is a side elevational view, partially broken away and in section, and showing an appliance in the nature of a hair dryer shielded in accordance with the present invention;

FIG. 3 is a sectional view, similar to FIG. 2, and showing an interior portion of a hair dryer appliance in accordance with the present invention;

FIG. 4 is a schematic perspective view showing a coil arrangement used in the appliance of the present invention; and FIG. 5 is a sectional view taken along line 5—5 of FIG. 2.

DETAILED DESCRIPTION OF A PREFERRED EMBODIMENT

Referring now in more detail and by reference characters to the drawings, which illustrate a preferred embodiment of the present invention, A designates an electromagnetic radiation shielded appliance which has been constructed in accordance with and embodies the present invention. In the embodiment of the invention as illustrated, the appliance is that of a hand-held hair dryer.

It should be noted that the appliance of the present invention is one which can be modified, such as by the addition of electromagnetic radiation insulating material and modification of the electrical portion thereof, as hereinafter described. Also, the invention encompasses new appliances which are initially constructed with the electromagnetic radiation insulating material on the exterior body thereof and with the circuit arrangement design, as also described herein.

The appliance of the present invention, as illustrated and described herein, is that of a hair dryer, that is one which is usually hand-held and used on a personal basis for drying an individual's hair. However, it should be understood that the invention is not so limited and that numerous devices which can be used in close proximity to the body of an individual can also be shielded in accordance with this invention.

The hair dryer in accordance with the present invention is initially of a conventional construction and includes a barrel type housing 10 along with a hand grip 12 connected thereto and which operable through a trigger mechanism, or other switch mechanism 14. Included within the barrel type housing 10 is an electrical heating coil 16 which extends throughout a substantial portion of the barrel type housing or barrel. A blower 18 is also included in the housing and is located to blow air past the heating coil 16 so that air exiting an open end 20 of the barrel type housing is heated air. Typically, hair dryers of this type include an electrical cable 22 for providing a source of electrical power, both to the electrical heating coil and the blower.

The hair dryer of the present invention is provided with a barrel shield 30 which extends concentrically about and in close proximity to the exterior surface of the barrel 10. In this case, the barrel shield 30 is disposed in concentric contact with the exterior surface of the cylindrically shaped barrel of the dryer A. Moreover, and by reference to FIGS. 1 and 2, it can be seen that the barrel shield extends for substantially the entire length of the barrel. Moreover, the barrel shield 30 has a lip 32 which extends beyond the open end 20 of the barrel.

The hand grip 12 of the hand-held hair dryer A is also provided with an electromagnetic radiation hand grip shield 34 and which extends around and is in contact with the hand grip 12. In addition, a bottom shield plate 36 extends over the bottom of the hand grip 12 on hand-held hair dryer and is provided with an opening 38 to accommodate the electrical cable 22. It should be recognized that where the electrical cable exits other portions of the hand-held hair dryer, an opening would be provided in the shielding at that location in order to accommodate the electrical cable.

It should also be recognized in accordance with FIGS. 1 and 2 that the hand grip shield 34 terminates, at its upper margin, in close proximity, if not abutting engagement to, the barrel shield 30. In this way, substantially the entire full outer surface of the dryer is shielded from electromagnetic radiation.

The electromagnetic insulating material, which is preferably used as a shield, is usually one of several metal materials having a high magnetic permeability and preferably having a magnetic permeability exceeding ten thousand. The metals which have these high degrees of magnetic permeability have been found to be primarily iron alloys. As an example, that material known as the 4750 alloy under AMTS standards, and containing forty-seven percent (47%)

nickel and fifty-two percent (52%) iron, has be found to possess an excellent degree of permeability and is quite suitable for use in the present invention. This alloy, for example, has a magnetic permeability of eighty thousand. Iron, in the non-alloy state, has a magnetic permeability of roughly about one hundred fifty with a maximum permeability of five thousand. The 4750 alloy, on the other, has a magnetic permeability of about eighty thousand.

Another highly effective alloy which can be used is that alloy known as Superalloy containing about five percent (5%) molybdenum, eighty percent (80%) nickel, and the balance being of iron. This material has a magnetic permeability of about four hundred fifty thousand. There is also the alloy known as Metglass offered by Allied Corporation and which is an amorphous alloy contained seventy-nine percent (79%) iron, sixteen percent (16%) boron and five percent (5%) silicon. In addition, that alloy known as Supermentor containing about forty-nine percent (49%) cobalt and fifty-one percent (51%) iron is effective.

It has also been found that the shielding material, preferably when formed of the alloys, as described above, should have a thickness of no less than 0.030 inch to about 0.040 inch. There is generally no maximum thickness, although that determined by a desirable weight constraint. Nevertheless, it has been found that composite shells of this type do not materially add significant weight to the device when used in the preferred thickness range.

It has been found in accordance with the present invention that conventional hand-held appliances of the type described herein have originally generated 700 Gauss of radiation. Moreover, all of this radiation was substantially available for absorption by an individual using this appliance. It is has also been found in accordance with the present invention that substantially all of this radiation is shielded from emission by the appliance. Thus, for example, when the hand-held hair dryer is shielded as disclosed herein, there has only been an emission of less than two milli-Gauss of electromagnetic radiation.

It has also been found in accordance with the present invention that it is necessary to locate any shielding material in very close proximity to the actual appliance on the body, as aforesaid. It is also possible to form the appliance with the actual housing formed of the alloy materials. However, it has been found, as a matter of practicality, that it is easier for manufacturers of several appliances to produce the appliance with the typical plastic housing normally employed and thereafter apply the shielding of the type described herein to these plastic housings.

In many cases, the appliance itself must be revised. As a simple example, in the case of a hair dryer which was initially conventional, it has been found that any coil, such as the heating coil 16 must be removed and replaced by a double wound coil 40 of the type shown in FIG. 4. In this case, there is a first set of convolutions 42 and the coil is then wrapped back upon itself forming a second set of convolutions 44 in the opposite direction. It has been found that by wrapping a coil back upon itself that there is in effect a canceling-out of the radiation, such that the amount of radiation which would otherwise have been generated and emitted from the device is substantially reduced.

It has also been found in accordance with the present invention that any loose wires should be effectively braided, also in the manner as shown in FIG. 3. Thus, the electrical conductors 46 and 48 which connect the heating coil 16 and the blower 18 to the conductor 22 are all braided. Again, it has been found in connection with the present invention that a substantial amount of electromagnetic energy which might otherwise be generated and emitted is substantially reduced.

Thus, there has been illustrated and described a unique and novel electromagnetic radiation shielded hand-held electrical appliance which substantially reduces, if not otherwise eliminates, exposure to electromagnetic radiation and which thereby fulfills all of the objects and advantages which have been sought therefor. It should be understood that many changes, modifications, variations and other uses and applications will become apparent to those skilled in the art after considering this specification and the accompanying drawings. Therefore, any and all such changes, modifications, variations and other uses and applications which do not depart from the spirit and scope of the invention are deemed to be covered by the invention.

What is claimed is:

1. A hand-held electrically operable appliance of the type used with or in close proximity to an individual with substantially electromagnetic radiation exposure, said appliance comprising:
   a) an outer housing having an elongate section and a hand grippable section;
   b) a metallic shield against electromagnetic radiation located at said elongate section and said hand grippable section of said outer housing and which shield is in close fitting contact with said outer housing;
   c) means permitting receipt of an electrical conductor extending from said housing outwardly beyond said shield for connection to a source of electrical power; and
   d) said electromagnetic radiation shield having a magnetic permeability of at least ten thousand and substantially fully covering the outer housing of said appliance to thereby reduce exposure to electromagnetic radiation.

2. The hand-held electrically operable appliance of claim 1 further characterized in that said appliance is a hand-held appliance in which the elongate section is a tubular barrel and the hand grippable section is a hand grip mounted on and extending outwardly from said tubular barrel, and said shield comprises a first shield section extending along said tubular barrel in insulating position thereon and a second shield section extending along said hand grippable section.

3. The hand-held electrically operable appliance of claim 1 further characterized in that means is provided in either said first shield section or said second shield section to accommodate an actuating switch for said appliance.

4. The hand-held electrically operable appliance of claim 1 further characterized in that said shield is formed of an iron alloy material.

5. The hand-held electrically operable appliance of claim 4 further characterized in that said shield is comprised primarily of an iron alloy material.

6. The hand-held electrically operable appliance of claim 1 further characterized in that said appliance is a hand-held appliance in which the elongate section is a tubular barrel and the hand grippable section is a hand grip mounted on and extending outwardly from said tubular barrel, and a radiation shield comprising a first shield section extending over said tubular barrel and a second shield section extending over said hand grip.

7. The hand-held electrically operable appliance of claim 6 further characterized in that said convolutions extend axially through a portion of the barrel of said appliance.

8. The hand-held electrically operable appliance of claim 6 further characterized in that said first shield section extends axially beyond the end of the barrel providing a lip thereon.

9. The hand-held electrically operable appliance of claim 1 further characterized in that said shield is a metal alloy having a thickness of no less than 0.030 inch.

10. A hand-held electrically operable appliance of the type used with or in close proximity to an individual and constructed to substantially reduce electromagnetic radiation exposure, said appliance comprising:
   a) an outer housing having an elongate section and a hand grippable section;
   b) an electrical wire coil disposed within said housing and forming part of said appliance;
   c) said electrical wire coil having convolutions of wire in a first direction and convolutions of wire in a second direction so that the convolutions effectively cancel out the electromagnetic radiation from one another.

11. A hand-held electrically operable appliance of the type used with or in close proximity to an individual and constructed to substantially reduce electromagnetic radiation exposure, said appliance comprising:
   a) an outer housing having an elongate section and a hand grippable section;
   b) at least one elongate electrical wire core extending within said housing and connected to an electrically operable component in said housing, said coil comprising convolutions in a first direction and convolutions in a second direction and effectively arranged to cancel out radiation from the coil;
   c) an electrical conductor connected to said electrical wire and being adapted for connection to a source of electrical power; and
   d) the portion of the electrical wire within said housing being braided tightly with knots so as to reduce the generation and emission of electromagnetic radiation.

12. The hand-held electrically operable appliance of claim 11 further characterized in that said appliance is a hand-held appliance in which the elongate section is a tubular barrel and the hand grippable section is a hand grip mounted on and extending outwardly from said tubular barrel, and an electromagnetic radiation shield on said appliance which comprises a first shield section extending over said tubular barrel and a second shield section extending over said hand grip.

13. The hand-held electrically operable appliance of claim 12 further characterized in that a means is provided in either said first shield section or said second shield section to accommodate an actuating start button for said appliance.

14. A hand-held electrically operable appliance of the type used with or in close proximity to an individual with substantially reduced electromagnetic radiation exposure, said appliance comprising:
   a) an outer housing having an elongate section and a hand grippable section;
   b) a shield against electromagnetic radiation surrounding said elongate section and said hand grippable section of said outer housing and which is in close fitting contact with said outer housing;
   c) means permitting receipt of an electrical conductor extending from said housing outwardly beyond said shield for connection to a source of electrical power;
   d) said electromagnetic radiation shield substantially fully covering the outer housing of said appliance to thereby reduce exposure to electromagnetic radiation;
   e) an electrically operable coil within said housing, said coil having convolutions in a first direction and convolutions in a second direction so as to effectively cancel out electromagnetic radiation generated by said coil within said housing;
   f) a wire extending through a portion of said housing; and
   g) said wire within said housing being wound in the form of a braid and effectively knotted so as to also reduce emission of electromagnetic radiation.

15. The hand-held electrically operable appliance of claim 14 further characterized in that said appliance is a hand-held appliance in which the elongate section is a tubular barrel and the hand grippable section is a hand grip mounted on and extending outwardly from said tubular barrel, and said shield comprises a first shield section extending over said tubular barrel and a second shield section extending over said hand grip.

16. A method of reducing electromagnetic radiation from a hand-held appliance, said method comprising:
   a) inserting an electromagnetic shield around an outer housing of said appliance substantially fully enclosing said outer housing;
   b) forming convolutions of a coil in said housing in a first direction and in an opposite second direction and which convolutions are closely spaced to one another so as to effectively cancel out electromagnetic radiation generated therewithin; and
   c) extending a portion of the shield on said elongate section beyond an end of the elongate section.

17. A hand-held electrically operable appliance of the type used with or in close proximity to an individual with substantially electromagnetic radiation exposure, said appliance comprising:
   a) an outer housing having an elongate section and a hand grippable section;
   b) a shield formed of an iron alloy sufficient to reduce emission of electromagnetic radiation located at said elongate section and said hand grippable section of said outer housing and which shield is in close fitting contact with said outer housing;
   c) means permitting receipt of an electrical conductor extending from said housing outwardly beyond said shield for connection to a source of electrical power; and
   d) said electromagnetic radiation shield having a magnetic permeability of at least ten thousand and a thickness of no less than 0.030 inch, said shield substantially fully covering the outer housing of said appliance to thereby reduce exposure to electromagnetic radiation.

18. The hand-held electrically operable appliance of claim 17 further characterized in that said appliance is a hand-held appliance in which the elongate section is a tubular barrel and the hand grippable section is a hand grip mounted on and extending outwardly from said tubular barrel, and said shield comprises a first shield section extending along said tubular barrel in insulating position thereon and a second shield section extending along said hand grippable section.

19. The hand-held electrically operable appliance of claim 18 further characterized in that said shield is comprised of an iron alloy material.

* * * * *